(12) United States Patent
Oliveira et al.

(10) Patent No.: US 9,249,246 B2
(45) Date of Patent: Feb. 2, 2016

(54) METHOD FOR OBTAINING A PIEZOELECTRIC LINER FOR A HIGH PRESSURE STORAGE VESSEL

(71) Applicant: Belenos Clean Power Holding AG, Bienne (CH)

(72) Inventors: Fabiane Oliveira, Bern (CH); Yves Leterrier, Lausanne (CH); Jan-Anders Manson, Chexbres (CH)

(73) Assignee: Belenos Clean Power Holding AG, Bienne (CH)

( * ) Notice: Subject to any disclaimer, the term of this patent is extended or adjusted under 35 U.S.C. 154(b) by 0 days.

(21) Appl. No.: 13/860,712

(22) Filed: Apr. 11, 2013

(65) Prior Publication Data

US 2013/0289199 A1 Oct. 31, 2013

(30) Foreign Application Priority Data

Apr. 27, 2012 (EP) .................................. 12165884

(51) Int. Cl.
| | |
|---|---|
| *F17C 13/02* | (2006.01) |
| *C08F 214/22* | (2006.01) |
| *F17C 3/06* | (2006.01) |
| *F17C 1/16* | (2006.01) |
| *C08L 27/16* | (2006.01) |

(52) U.S. Cl.
CPC .................. *C08F 214/22* (2013.01); *F17C 1/16* (2013.01); *F17C 3/06* (2013.01); *F17C 13/02* (2013.01); *C08L 27/16* (2013.01); *F17C 2201/0104* (2013.01); *F17C 2203/0604* (2013.01); *F17C 2203/066* (2013.01); *F17C 2203/0619* (2013.01); *F17C 2203/0675* (2013.01); *F17C 2209/21* (2013.01); *F17C 2209/2109* (2013.01); *F17C 2209/232* (2013.01); *F17C 2223/0123* (2013.01); *F17C 2223/035* (2013.01); *F17C 2223/036* (2013.01); *Y02E 60/321* (2013.01)

(58) Field of Classification Search
CPC ......... C08F 214/22; C08L 27/16; F17C 13/02
See application file for complete search history.

(56) References Cited

U.S. PATENT DOCUMENTS

| | | | | |
|---|---|---|---|---|
| 4,778,867 A | * | 10/1988 | Preis .............................. | 526/255 |
| 4,851,682 A | * | 7/1989 | Moriyama et al. .......... | 250/338.3 |
| 5,679,753 A | * | 10/1997 | Ohigashi et al. .............. | 526/255 |
| 7,718,229 B2 | * | 5/2010 | Kodani et al. ............... | 427/385.5 |

FOREIGN PATENT DOCUMENTS

| | | |
|---|---|---|
| DE | 10 2011 119 771 A1 | 6/2012 |
| GB | 2489610 A | 10/2012 |
| WO | WO 2004/110922 A2 | 12/2004 |

(Continued)

OTHER PUBLICATIONS

Schweitzer (Corrosion Engineering Handbook. Chapter 23: Sheet Linings, Section III: Design Considerations. 1996, pp. 589-593).*

(Continued)

*Primary Examiner* — Brieann R Fink
(74) *Attorney, Agent, or Firm* — Oblon, McClelland, Maier & Neustadt, L.L.P.

(57) ABSTRACT

The piezoelectric and barrier liner for a high-pressure storage vessel is made out of PVDF-TrFE copolymer and the amount of crystallinity in the liner material is over 30%, preferably 35% at least.

5 Claims, 1 Drawing Sheet

(56) References Cited

FOREIGN PATENT DOCUMENTS

| WO | WO 2011/104295 A1 | 9/2011 |
| WO | WO 2011104295 A1 * | 9/2011 |

OTHER PUBLICATIONS

Oliveira (Novel High Barrier and Piezoelectric Nanocomposites based on Fluorinated Polymer. Nano-Tera Annual Plenary Meeting 2012: Virtual Edition. Apr. 27, 2012. 1 page).*

Dargaville (Characterization, Performance and Optimization of PVDF as Piezoelectric Film for Advanced Space Mirror Concepts. Sandia Report. Nov. 2005. 49 pages).*

Foster (Electrophoretic Deposition of the Piezoelectric Polymer P(VDF-TrFE), Meeting Abstracts—Electrochemical Society—All Divisions, Electrochemical Society Meeting; $201^{st}$, 2002, 17 pages).*

European Search Report issued Jan. 23, 2013, in European Patent Application No. 12165884.3, filed Apr. 27, 2012.

* cited by examiner

METHOD FOR OBTAINING A PIEZOELECTRIC LINER FOR A HIGH PRESSURE STORAGE VESSEL

This application claims priority from European Patent Application No. 12165884.3 filed Apr. 27, 2012 the entire disclosure of which is incorporated herein by reference.

FIELD OF THE INVENTION

The present invention relates to barrier liners for high pressure vessels. More specifically, the present invention concerns such barrier liners that are made out piezoelectric polymer films, as well as to methods for obtaining such films and liners.

BACKGROUND OF THE INVENTION

Hollow composite structures, or pressure vessels, here referred to as "vessels", such as pressurized gas tanks, have traditionally been made out of metal such as steel or aluminum. However, in recent years, the use of composite vessels has become more prevalent. Such vessels are manufactured by a variety of processes, which include but are not limited to filament winding, resin transfer molding and bladder-assisted molding.

Most composite material exhibit a relatively high permeability to many fluids. It is therefore usually necessary to provide a barrier liner within the pressure vessel in order to prevent excessive leakage. Certain polymer based liners offer good resistance to permeation, heat and chemical attack, making them suitable for high pressure media storage. It is known in particular to include a HDPE liner in filament-wound composite vessels.

Furthermore, high pressure vessels require monitoring to avoid overfilling and to detect leakage. This is usually achieved through pressure sensors and regulators at the vessel neck. Such external pressure gauges are relatively expensive and they are usually fitted to the vessel only during service. For the rest of the time, in particular during storage and transportation phases, the pressure in the tank cannot readily be known. In order to overcome this drawback, patent document WO 2011/104 295 discloses a pressure vessel comprising a liner exhibiting both barrier and piezoelectric properties. Piezoelectric materials have shown suitability as pressure sensors, as they produce a charge when subjected to an external force, allowing changes in pressure to be measured. Accordingly, the above prior art document teaches that by using the piezoelectric liner to monitor the pressure inside the pressure vessel, it is possible to dispense with the external pressure gauge. Patent document WO 2011/104 295 is incorporated by reference.

One difficulty with the above solution is to provide a liner that combines excellent barrier properties with an intense piezoelectric effect. It is therefore the main object of the present invention to provide such a liner.

SUMMARY OF THE INVENTION

According to a first aspect of the present invention, it achieves this objective by providing a liner in accordance to the annexed claim 1.

According to a second aspect, the present invention achieves the above objective by providing a copolymer film for use as a liner in a high pressure storage vessel; the copolymer film being obtained by means of the method according to claim 2.

The PVDF-TrFE (Poly(vinylidene fluoride-trifluorethylene) copolymer film and liner according to the invention exhibit an intense piezoelectric effect. Furthermore, the film and liner also exhibit a surprisingly low permeability to most gases; oxygen and hydrogen in particular. This low permeability makes the PVDF-TrFE copolymer film according to the invention particularly well suited for use as a barrier liner in a high pressure storage vessel.

According to a preferred implementation of the invention, the PVDF-TrFE copolymer comprises between 70 and 80 mol % of VDF (vinylidene fluoride). Experimentation conducted by the applicant has shown that these proportions provide for best results concerning permeability as well as piezoelectric effect.

According to another preferred implementation of the invention, the annealing step is carried out for at least three hours; more preferably 4 hours.

According to yet another preferred implementation of the invention, the annealing step is carried out at a temperature between 125 and 140° C.

According to still another preferred implementation of the invention, the step of poling the annealed film is carried out using an electrostatic field between 700 and 800 KV/cm.

BRIEF DESCRIPTION OF THE DRAWINGS

Other features and advantages of the present invention will appear upon reading the following description, given solely by way of non-limiting example, and made with reference to the annexed drawings, in which.

DETAILED DESCRIPTION OF THE INVENTION

Figure 2:
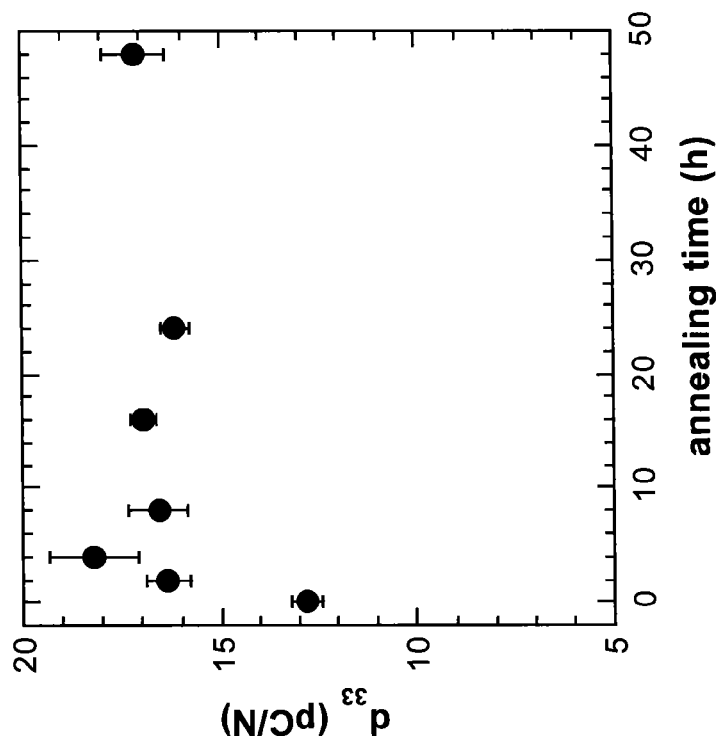
FIG. 2 is a graph of the piezoelectric coefficient $d_{33}$ as function of annealing time.

For a liner to be incorporated into a pressure vessel, it must have the same hollow form as the cavity inside the vessel. In particular, in the case of a cylindrical vessel, the liner should be tubular. This can be achieved through various techniques.

One practical way of forming the liner is to start from a planar film. From this starting point, there are two options. A first option is to go through the steps of annealing the polymer film and of poling the annealed film before forming the liner. Once these steps have been taken, the annealed and poled planar film can, for instance, be rolled into a tube and welded in order to form an airtight joint. Another possibility is to make the annealed and poled planar film into a roll, wherein the multiple overlapping layers of the roll create an airtight tube without the need for an airtight joint.

The second option is to begin by shaping the planar film into a liner, and to then go through the steps of annealing and poling the polymer material. In this case, the poling operation is slightly more complicated as one of the two poling electrodes must be designed so that it can be introduced into the liner through an opening.

Another way of forming the liner is to start from molten polymer. This starting material can be molded (blow molded for example) into a closed form with thin, film-like, walls. According to this method, the polymer film forming the walls of the liner is then annealed and of poled.

Liner materials can be incorporated into vessels of different types through a range of techniques, depending on the type of vessel shell and its fabrication method. One alternative is to form the shell after the liner. According to this alternative, the liner can, for example, be used as a bladder in the case of bladder inflation or assisted molding. Another possibility is to use of a removable mandrel to support the liner for the subsequent filament winding of the composite shell on the exterior of the liner. Another alternative is to begin by forming the exterior shell. The liner can then be formed by resin coating, sputtering, etc. According to this last alternative, the steps of annealing and poling must be carried out with the liner inside the vessel shell. In this case, the poling operation can be carried out with a special poling electrode designed so that it can be introduced into the liner through the opening of the shell. Finally a blow molded liner can also be introduced into the shell.

Preparation of the P(VDF-TrFE) Copolymer Starting Material

P(VDF-TrFE) copolymer can be obtained from various suppliers. For example, the applicant obtained P(VDF-TrFE) (79/21 mol %) copolymer in powder form from the company Solvay Solexis.

a) Solvent Casting Method

Films can be prepared by first dissolving the P(VDF-TrFE) powder in a solvent (for example methyl ethyl ketone) at 60° C. during 2 hours. Once the polymer is dissolved, it is poured onto a flat surface and then submitted to low vacuum overnight in order to encourage solvent evaporation. This process yields a plannar P(VDF-TrFE) copolymer film a few tens of microns thick. Optionally, the process can be repeated to increase the thickness of the film.

b) Molding

The P(VDF-TrFE) powder can be heated to above its melting temperature. The molten polymer can then be molded by any appropriate means known to the person skilled in the art.

Example

A planar copolymer P(VDF-TrFE) film was obtained by the solvent casting method described above. The obtained film was cut into four samples. One of the samples was not annealed, the three other samples were annealed for 2, 4 and 16 hours respectively. The annealing temperature was 130° C.

The four samples were subsequently poled for 30 minutes at 110° C. and then for 30 more minutes while cooling down. The intensity of the electrostatic field was 750 KV/cm.

Characterization

Differential scaning calorimetry (DSC) tests were performed On a TA Instrument DSC Q100 under $N_2$ environment. The samples were cooled to minus 50° C. at 10.0° $Cmin^{-1}$ and held there for three minutes before being heated to 160° C. at the same rate. The DSC tests were used to measure the amount of crystallinity in each sample.

Oxygen permeation tests were performed on an Oxygen Permeation Analyser-Systech Instruments Model 8001. The oxygen permeation rate (OTR) of each sample was recorded at 10, 20, 30, 40 and 50° C., under 0% of relative humidity and 1 bar of $O_2$ pressure. Oxygen permeability (P) was calculated using the formula:

$P = t \times OTR$

Figure 1:
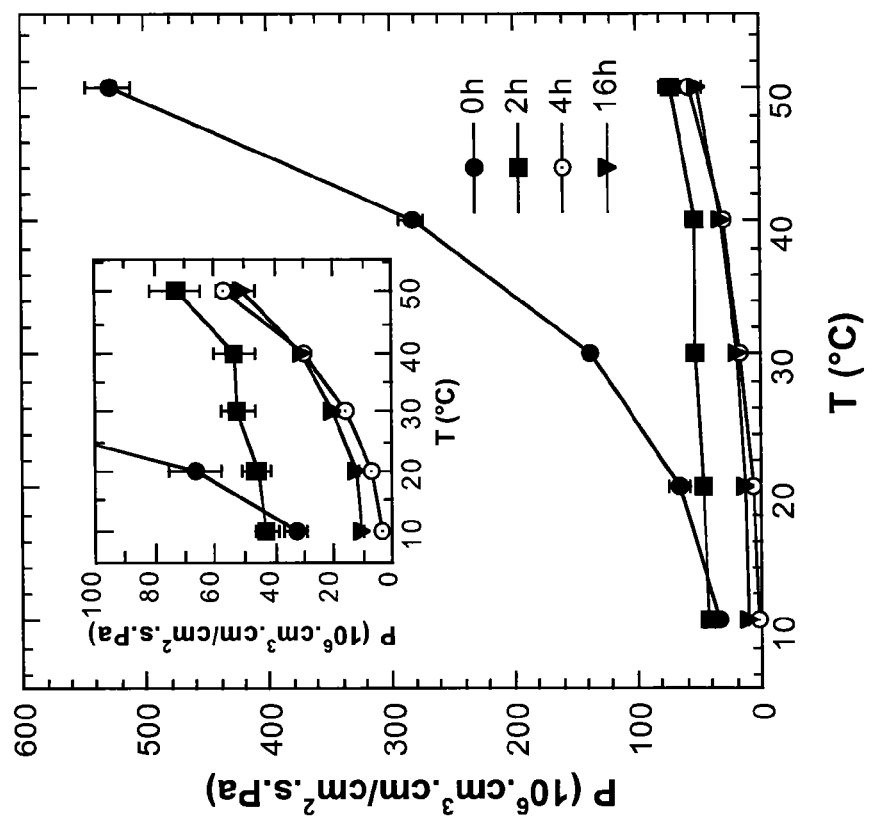
FIG. 1 is a graph showing the permeability of a polymer sheet as function of temperature for different annealing times.

The results are shown in the graph of FIG. 1.

For the piezoelectric coefficient measurement ($d_{33}$), a sub-sample shaped as a circle of 1 cm diameter was taken from each sample. The average thicknesses of the four subsamples was measured prior to testing, and chromium and gold layered electrodes were then deposited on the films by sputtering. The samples were then poled at 110° C. for 30 minutes and then cooled for another 30 minutes, using an electric field (E) of 750 $kVcm^{-1}$. The piezoelectric constant of each subsample was then measured. The results are shown in the graph of FIG. 2.

What is claimed is:

1. A liner,
   wherein the liner comprises a PVDF-TrFE (poly(vinylidene fluoride-trifluoroethylene)) copolymer having a crystallinity of over 30%, wherein the PVDF-TrFE copolymer has been annealed for a time period of from 4 to 16 hours,
   the liner has a permeability ranging from 0 to 60 $10^6 \cdot cm^3 \cdot cm/cm^2 \cdot s \cdot Pa$ at a temperature ranging from 12 to 50° C., and
   a piezoelectric coefficient of the liner is above 15 pC/N.

2. The liner of claim 1, wherein the crystallinity of the copolymer is at least 35%.

3. A high-pressure storage vessel having a barrier liner, wherein the barrier liner is made out of a material based on PVDF-TrFE (poly(vinylidene fluoride-trifluoroethylene)) copolymer, the material having a crystallinity which is over 30%, wherein the PVDF-TrFE copolymer has been annealed for a time period of from 4 to 16 hours,
   the liner has a permeability ranging from 0 to 60 $10^6 \cdot cm^3 \cdot cm/cm^2 \cdot s \cdot Pa$ at a temperature ranging from 12 to 50° C., and
   a piezoelectric coefficient of the liner is above 15 pC/N.

4. A liner, consisting of PVDF-TrFE (poly(vinylidene fluoride-trifluoroethylene)) copolymer having a crystallinity of over 30%, wherein the PVDF-TrFE copolymer has been annealed for a time period of from 4 to 16 hours,
   the liner has a permeability ranging from 0 to 60 $10^6 \cdot cm^3 \cdot cm/cm^2 \cdot s \cdot Pa$ at a temperature ranging from 12 to 50° C., and
   a piezoelectric coefficient of the liner is above 15 pC/N.

5. A method for forming a liner comprising a P(VDF-TrFE) copolymer having a crystallinity of over 30%, the method comprising:
   preparing a P(VDF-TrFE) copolymer starting material, comprising between 55 and 82 mol % of VDF, in the form of a planar copolymer P(VDF-TrFE) film or of a molten copolymer;
   annealing the P(VDF-TrFE) copolymer starting material for a time period of from 4 to 16 hours at a temperature between 120 and 145° C. to obtain a polymer film;
   poling the film; and
   forming the liner before or after the annealing and the poling of the P(VDF-TrFE) copolymer, wherein the liner has a permeability ranging from 0 to 60 $10^6 \cdot cm^3 \cdot cm/cm^2 \cdot s \cdot Pa$ at a temperature ranging from 12 to 50° C., and a piezoelectric coefficient of the liner is above 15 pC/N.

* * * * *